United States Patent [19]
Wong et al.

[11] Patent Number: 5,644,269
[45] Date of Patent: Jul. 1, 1997

[54] CASCODE MOS CURRENT MIRROR WITH LATERAL BIPOLAR JUNCTION TRANSISTOR TO ENHANCE OUPUT SIGNAL SWING

[75] Inventors: Shyh-Chyi Wong, Taichung; Mong-Song Liang, Hsin-chu, both of Taiwan

[73] Assignee: Taiwan Semiconductor Manufacturing Company, Hsin-chu, Taiwan

[21] Appl. No.: 570,297

[22] Filed: Dec. 11, 1995

[51] Int. Cl.[6] .................... H03F 3/45; H03F 3/16
[52] U.S. Cl. .................. 330/261; 330/257; 330/288; 330/253; 323/315
[58] Field of Search ...................... 330/253, 257, 330/261, 288; 323/315, 316

[56] References Cited

U.S. PATENT DOCUMENTS

| | | | |
|---|---|---|---|
| 4,550,291 | 10/1985 | Millaway et al. | 330/277 |
| 4,896,094 | 1/1990 | Greaves et al. | 323/316 X |
| 4,897,596 | 1/1990 | Hughes et al. | 323/315 |
| 5,049,833 | 9/1991 | Miller | 330/257 X |
| 5,245,273 | 9/1993 | Greaves et al. | 323/315 X |

*Primary Examiner*—James B. Mullins
*Attorney, Agent, or Firm*—George O. Saile

[57] ABSTRACT

A MOS transistor current mirror having a low output voltage is described. A first and second MOST's have their drains and gates connected respectively to form MOS diodes. The drain of the first MOST is connected to a control constant current source and the source of first MOST is connected to the drain of the second MOST. The drain and gate of the first MOST are connected to the base of a bipolar junction transistor (BJT). The collector of the BJT is connected to a first power supply line and the emitter is connected to the gate of a third MOST. A resistor is connected between the emitter of the BJT and the a second power supply line. The gate and drain of the second MOST is connected to the gate of a fourth MOST. The sources of the second and fourth MOST's are connected to the second power supply line. The drain of the fourth MOST is connected to the source of the third MOST. The drain of the third MOST is connected to external circuitry. The voltage developed between the drain of the third MOST and the second power supply line is relatively small to allow the voltage developed by the external circuitry to be relatively large, while said current mirror is providing a constant current to said external circuitry.

19 Claims, 4 Drawing Sheets

CASCODE MOS CURRENT MIRROR WITH LATERAL BIPOLAR JUNCTION TRANSISTOR TO ENHANCE OUPUT SIGNAL SWING

BACKGROUND OF THE INVENTION

1. Field of the Invention

This invention relates to Metal Oxide Semiconductor Field Effect Transistor (MOST) circuits, especially those compatible with monolithic integrated circuits and more particularly cascoded circuits configured for the sourcing of constant currents to other circuits present upon the monolithic integrated circuits.

2. Description of Related Art

The cascode current mirror has been used for many years as an active load for an amplifier or as a current source for differentially connected pairs of transistors in a operational amplifier (Op Amp).

FIG. 1a shows a schematic representations of an ideal current mirror. The output current $i_{out}$ is proportional to the input current $i_{in}$ by a factor B, therefore:

$$i_{out} = i_{in} B$$

The most simple version of a current mirror is shown in FIG. 1b. It consists of two MOST's $M_1$ and $M_2$. MOST $M_1$ is connected as MOS diode and is driven by the current source $i_{in}$. The other MOST $M_2$ provides the output current $i_{out}$. Since the voltage developed from the gates to the sources of the two MOST's $M_1$ and $M_2$ are the same then the ratios of the currents is:

$$\frac{i_{out}}{i_{in}} = B = \frac{(w/l)^2}{(w/l)^1}$$

where (w/l) is the ratio of the width of the gate of the MOST to the length of the gate of the MOST.

By choosing the ratio appropriately, any arbitrary value of output current can be selected with precision.

The requirements for an ideal current source are the following:

The width to length ratio w/l of the two transistors precisely sets the current ratio.

The output impedance is very high so that the output current is independent of the output voltage. In FIG. 1b the output resistance of the circuit is $r_{o2}$ (the output resistance of the MOST $M_2$).

The value of the input resistance is very high.

The minimum output voltage $V_{out}$ for which the output acts as a current source is low.

FIG. 2 shows a cascoded current mirror. Two MOST's $M_1$ and $M_2$ determine the current ratio by the following:

$$\frac{i_{out}}{i_{in}} = B = \frac{(w/l)^2}{(w/l)^1}$$

where (w/l) is the ratio of the width of the gate of the MOST to the length of the gate of the MOST.

The output resistance $r_{out}$ of the circuit is increased to:

$$r_{out} = r_{o4}(1 + g_{m4} r_{o2})$$

where $r_{o4}$ is the output resistance of $M_4$, $g_{m4}$ is the transconductance of $M_4$, and $r_{o2}$ is the output resistance of $M_2$.

and the output capacitance of the circuit is reduced by the factor $g_{m4} r_{o2}$, thus increasing the output impedance.

The minimum output voltage $V_{out}$ of the circuit in FIG. 2 is higher since the minimum output voltage will be the sum of the gate to source voltage of $M_1$ and the drain to source voltage of $M_4$, which is always larger than the gate threshold voltage $V_T$. This high minimum $V_{out}$ of $M_4$ will seriously reduce the range of output signal swing, If $V_{out}$ is less than $v_t - 2\Delta v_t$, either $M_4$ or $M_2$ will fall out of the saturation region with very low output resistance $r_{o4}$ or $r_{o2}$. Reducing this minimum is necessary to increase the output swing.

FIG. 3 illustrates a circuit where the minimum $V_{out}$ is kept low by the MOST $M_4$ and the output resistance is kept high by the cascoded MOST $M_6$. The output voltage now becomes the sum of the drain to source saturation voltages ($V_{ds\,sat}$) for MOST $M_5$ and $M_6$. The minimum of this voltage will be lower than the $V_{out}$ in FIG. 2 by the voltage drop through $V_{gs}$ of $M_4$. However, this voltage will not be too low if the MOST's $M_5$ and $M_6$ are relatively very large or they are operated very close to weak inversion. Operating in weak inversion will degrade the output current and the current mirror fails. But, large $M_5$ and $M_6$ will take a large area and is not recommended in integrated circuits.

It is difficult in practice to design the transistors such that the drain to source voltages ($V_{DS}$) for $M_1$ and $M_5$ are equal which will result in an error term for the value of $i_{out}$. That is, if $$i_{in} = \frac{\beta_1}{2}(v_{gs} - v_t)^2 = \frac{\beta_1}{2} \Delta v_t^2$$

where:

$i_{in}$ is the magnitude of the current source $\beta_1$ is the transconductance parameter of $M_1$ $v_{gs}$ is the voltage developed from the gate to the source of $M_1$ $v_t$ is the threshold voltage of a MOST.

Then:

$$i_{out} = \frac{\beta_5}{2}(2v_t + 2\Delta v_t - v_t - \Delta v_t - \Delta v_t - v_t)^2 = 0$$

where $i_{out}$ is the output of the current mirror of FIG. 3

$\beta_5$ is the transconductance parameter of $M_5$

Further more if:

$$i_{in} = \frac{\beta_1}{2}(v_{gs} + v_t)^2 = \frac{\beta_1}{2} \Delta v_t^2,$$

then:

$$v_{g1} = v_{d1} = \Delta v_t + v_t$$

$$v_{g3} = v_{g4} = 2\Delta v_t + v_t$$

$$v_{g5} = \Delta v_t + v_t$$

where $v_{g1}$ is the voltage developed from the gate to the source of $M_1$, $v_{d1}$ is the voltage developed from the drain to the source of $M_1$, $V_{g3}$ is the voltage developed from the gate to the source of $M_3$, $V_{g4}$ is the voltage developed from the gate to the source of $M_4$, $V_{g5}$ is the voltage developed from the gate to the source of $M_5$, so a minimum:

$$v_{ds} \Delta v_t$$

where $V_{ds}$ is the voltages developed from the drain to the source of $M_5$.

Therefore:

$$v_{g6} = v_{g4} - v_t - \Delta v_t = v_t - \Delta v_t$$

where $V_{g6}$ is the voltage developed from the gate to the source of $M_6$.

Then:

$$i_{out} = \frac{\beta}{2} (v_{g6} - v_{ds} - v_t)^2 = 0$$

Additionally to keep $M_6$ in saturation with proper $i_{out}$, the gate width to gate length ratio (w/l) of $M_4$ and $M_6$ is very large. To keep reasonable $i_{out}$ the value of $\beta$ for $M_4$ and $M_6$ needs to be large. That is:

$$v_{g4} = 2\Delta v_t + 2v_t$$

$$v_{g6} = v_{g4} - v_t - \sqrt{\frac{\beta_1}{\beta_4}} \ \Delta v_t$$

$$v_{g6} = v_t + 2\Delta v_t - \sqrt{\frac{\beta_1}{\beta_4}} \ \Delta v_t$$

where $\beta_1$ is the transconductance parameter for $M_1$, $\beta_4$ is the transconductance parameter for $M_4$.

Therefore:

$$i_{out} = \frac{\beta_6}{2} (v_{g6} - v_{ds} - v_t)^2$$

$$i_{out} = \frac{\beta_6}{2} \left( \Delta v_t - \sqrt{\frac{\beta_1}{\beta_4}} \ \Delta v_t \right)^2$$

Thus $$\sqrt{\frac{\beta_1}{\beta_4}}$$

must be small and $\beta_6$ has to be large to have $$i_{out} = \frac{\beta_6}{2} (\Delta v_t)^2,$$

so that $$\frac{i_{in}}{i_{out}} = \frac{\beta_6}{\beta_1} = \frac{\left(\frac{w}{l}\right)^6}{\left(\frac{w}{l}\right)^1},$$

as in the ideal current source as shown in FIG. 1b.

It should be noted that if $$\sqrt{\frac{\beta_1}{\beta_6}}$$

is not large enough, then $i_{out}$ will be seriously degraded, such as $$i_{out} \ll \frac{\beta_6}{\beta_1} i_{in}$$

and the current mirror will fail.

U.S. Pat. No. 4,550,291 (Millway, et al.) teaches a technique for the design of an amplifier circuit using cascode circuitry to provide noise free operation.

U.S. Pat. No. 5,897,596 (Hughes, et al.) describes a MOS Transistor circuit using cascode current sources to provide processing for sampled analog signals.

SUMMARY OF THE INVENTION

An object of this invention is the reduction of the minimum output voltage of a cascode current mirror. Another object of this invention is the increase of the output resistance of the cascode current mirror. Still another object of this invention is the reduction of the area requirements of the circuit to perform the current mirror function.

To accomplish the aforementioned objects, this invention describes a MOS current mirror as shown in FIG. 4. A first and second MOST's have their drains and gates connected respectively. The drain and gate of the first MOST is connected to a control constant current source and the source of first MOST is connected to the drain and gate of the second MOST. The drain and gate of the first MOST are connected to the base of a bipolar junction transistor (BJT). The collector of the BJT is connected to a first power supply line and the emitter is connected to the gate of a third MOST. A resistor is connected between the emitter of the BJT and the a second power supply line. The gate and drain of the second MOST is connected to the gate of a fourth MOST. The sources of the second and fourth MOST's are connected to the second power supply line. The drain of the fourth MOST is connected to the source of the third MOST. The drain of the third MOST is connected to external circuitry.

The voltage developed between the drain of the third MOST and the second power supply line is relatively small to allow the voltage developed by the external circuitry to be relatively large, while said current mirror is providing a constant current to said external circuitry that is proportional to the controlling constant current source.

DETAILED DESCRIPTION OF THE INVENTION

Figure 4:
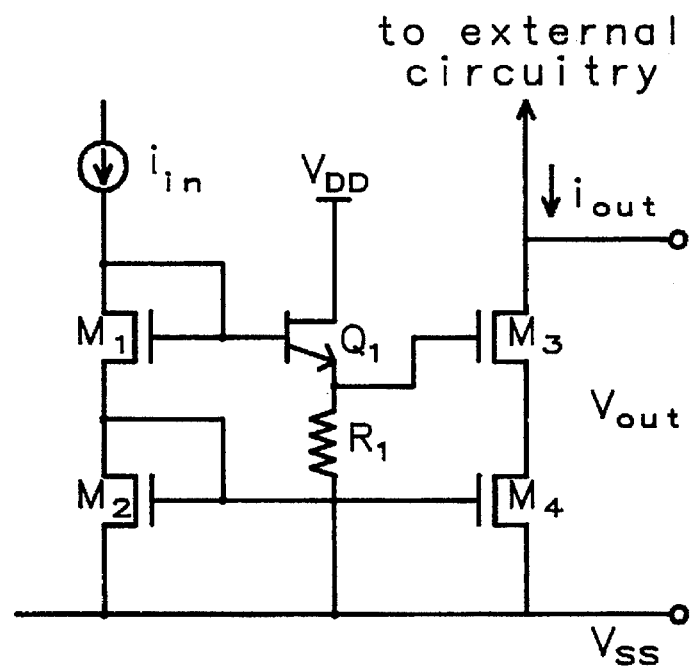
FIG. 4 is a schematic diagram of cascode current mirror with low output voltage of this invention.

Referring to FIG. 4, MOST's $M_1$ and $M_2$ have their respective drains and gates connected together to form diodes. The drain and gate of MOST $M_1$ is connected to the controlling current source $i_{in}$. The drain of MOST $M_2$ is connected to the source of $M_1$ and the gate of MOST $M_4$. The sources of MOST's $M_2$ and $M_4$ are tied to a power supply reference $V_{ss}$. These connections force the voltage developed between the gate and the source of MOST $M_2$ to be equal to the voltage developed between the gate and the source of MOST $M_4$, thus making the current through MOST $M_4$ ($i_{out}$) proportional to the current through MOST $M_1$ ($i_{in}$). This proportionality is given by:

$$\frac{i_{out}}{i_{in}} = B = \frac{(w/l)^4}{(w/l)^1}$$

where (w/l) is the ratio of the width of the gate of the MOST to the length of the gate of the MOST.

The source of MOST $M_3$ is connected to the drain of MOST $M_4$. The drain of MOST $M_3$ is connected to external circuitry so as to be able to source a current ($i_{out}$) of a constant magnitude to said external circuitry. The MOST's $M_3$ and $M_4$ are connected so as to increase the output resistance to:

$$r_{out} = r_{o3}(1 + g_{m3} r_{o4})$$

where $r_{o3}$ is the output resistance of $M_3$, $g_{m3}$ is the transconductance of $M_3$, and $r_{o4}$ is the output resistance of $M_4$.

The drain and gate of MOST $M_1$ is connected to the base of BJT $Q_1$. The collector of BJT $Q_1$ to the power supply line $V_{dd}$ and the emitter of the BJT $Q_1$ is connected to the gate of MOST $M_3$. The resistor $R_1$ is connected between the emitter of BJT $Q_1$ and the power supply reference $V_{ss}$. This configuration will keep MOST's $M_3$ and $M_4$ in saturation allowing an output voltage $V_{out}$ to approach a value of the voltage $2\Delta v_t$ where:

$$\Delta v_t = 2\sqrt{\frac{2 i_{out}}{\beta}}$$

for the MOST's $M_3$ and $M_4$.

Figure 1A:
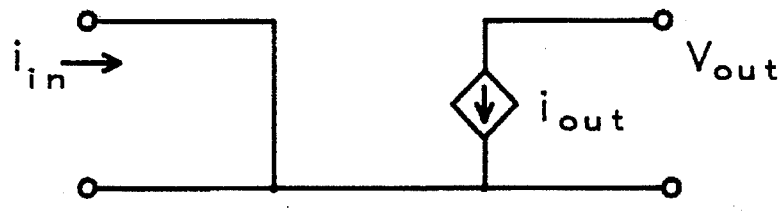
FIG. 1a is a schematic diagram of an ideal current mirror.
Figure 1B:
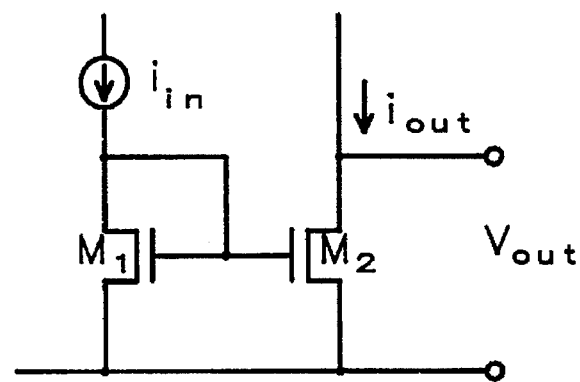
FIG. 1b is a schematic diagram of a simple MOS transistor current mirror of prior art.
Figure 2:
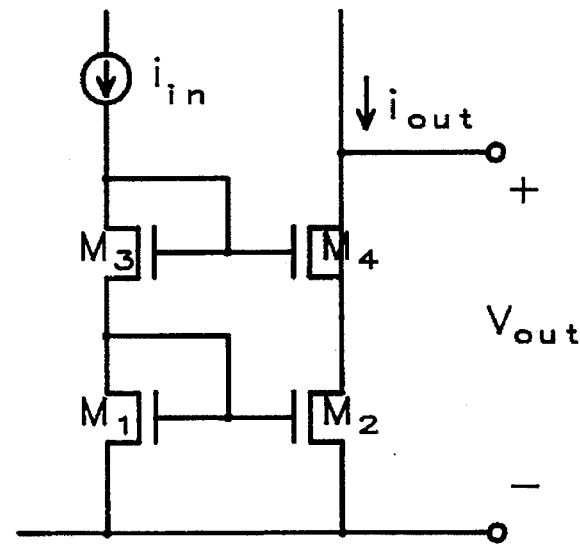
FIG. 2 is a schematic diagram of a cascode current mirror of prior art.
Figure 3:
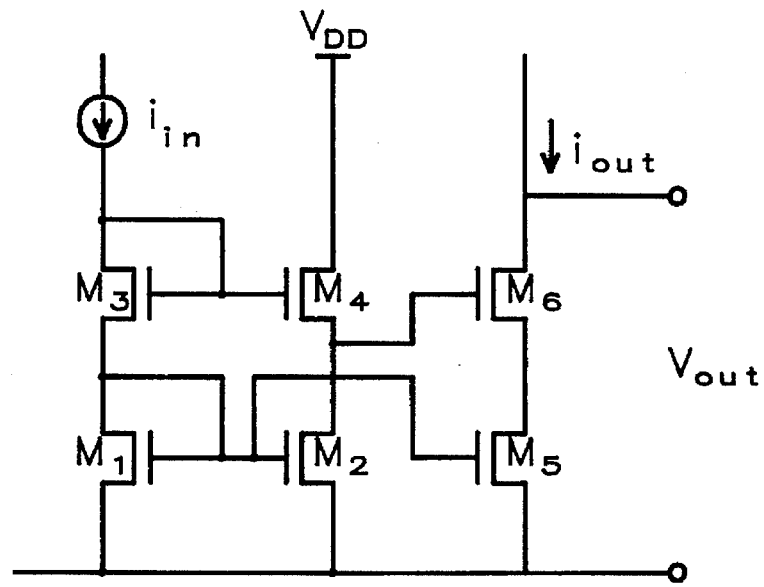
FIG. 3 is a schematic diagram of a cascode current mirror with low output voltage of prior art.
Figure 5:
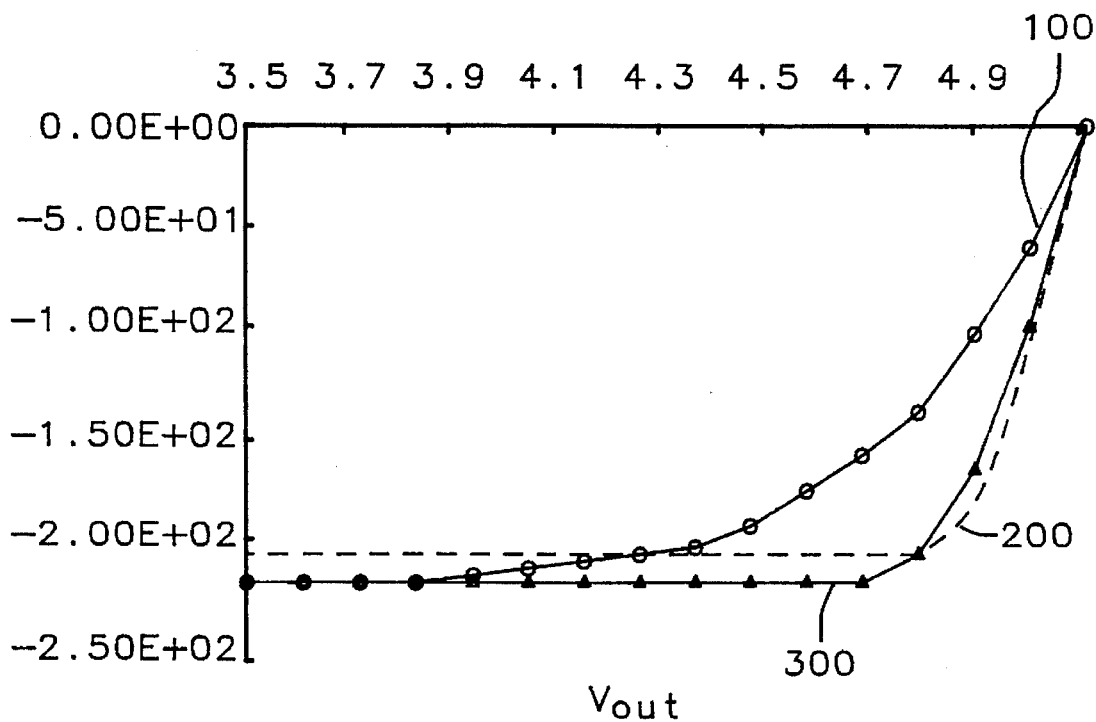
FIG. 5 is graph of the output current versus the output voltage of prior art and this invention.

A comparison of the output voltage $V_{out}$ versus the output current $i_{out}$ is shown in FIG. 5. The output voltage for a standard cascode design 100 like that shown in FIG. 2 is lower than either the output voltage of the MOS Current mirror with reduced output voltage 200 of prior art as shown in FIG. 3 or of the current invention 300 as shown in FIG. 4.

Figure 6:
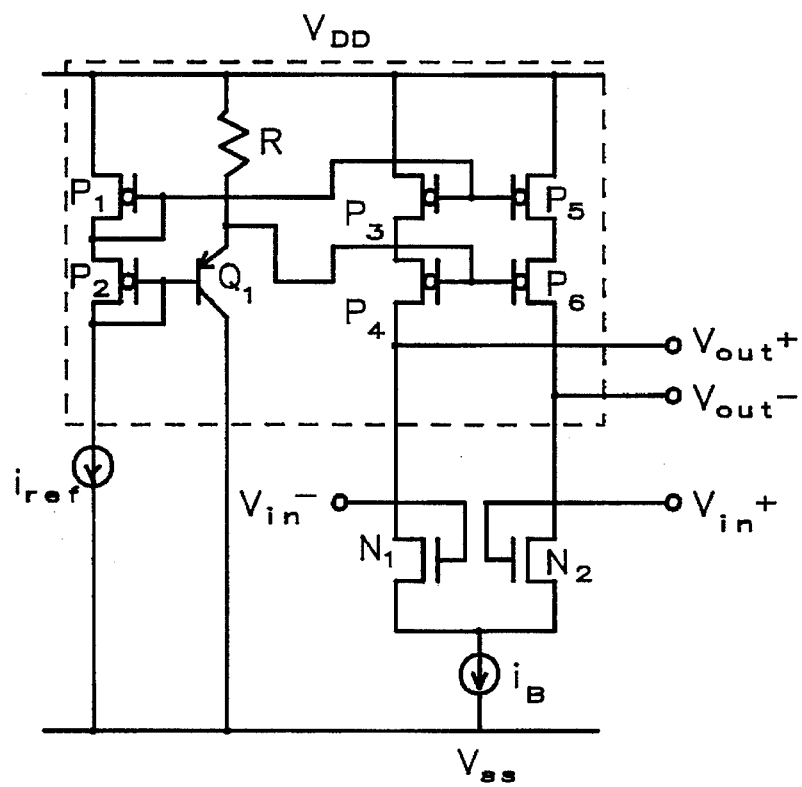
FIG. 6 is a schematic diagram of an application of this invention as an active load.

An application of the cascode current mirror of this invention is shown in FIG. 6. In this design, the current mirror is implemented as p-MOST and the output voltages $V_{out+}$ and $V_{out-}$ will be able to approach the level of the power supply $V_{dd}$ by approximately the value $2\Delta v_t$ with $\Delta v_t$ as defined in the above equation. It should be noted that the BJT Q1 has an area of ~90 µm², which is much more area efficient than the MOS-V-reduce as in FIG. 3 where $M_5$ and $M_6$ have an area of ~450 µm².

The n-MOST's $N_1$ and $N_2$ and current source $i_b$ form with the active load an Op Amp. The difference in the magnitude of the voltages $V_{in+}$ and $V_{in-}$ cause the output voltages $V_{out+}$ and $V_{out-}$ to be of an magnitude that is proportional to this difference. The magnitude of the current through the active loads p-MOST's $P_3$ and $P_4$, and $P_5$ and $P_6$ is equal to one half of the magnitude of the current source $i_b$. The ratio of the gate width to the gate length ratios of the p-MOST's $P_1$. $P_3$ and $P_5$ determines the proportional value of the magnitude of the currents through p-MOST's $P_3$ and $P_5$ to the magnitude of the current source $i_{ref}$.

Figure 7:
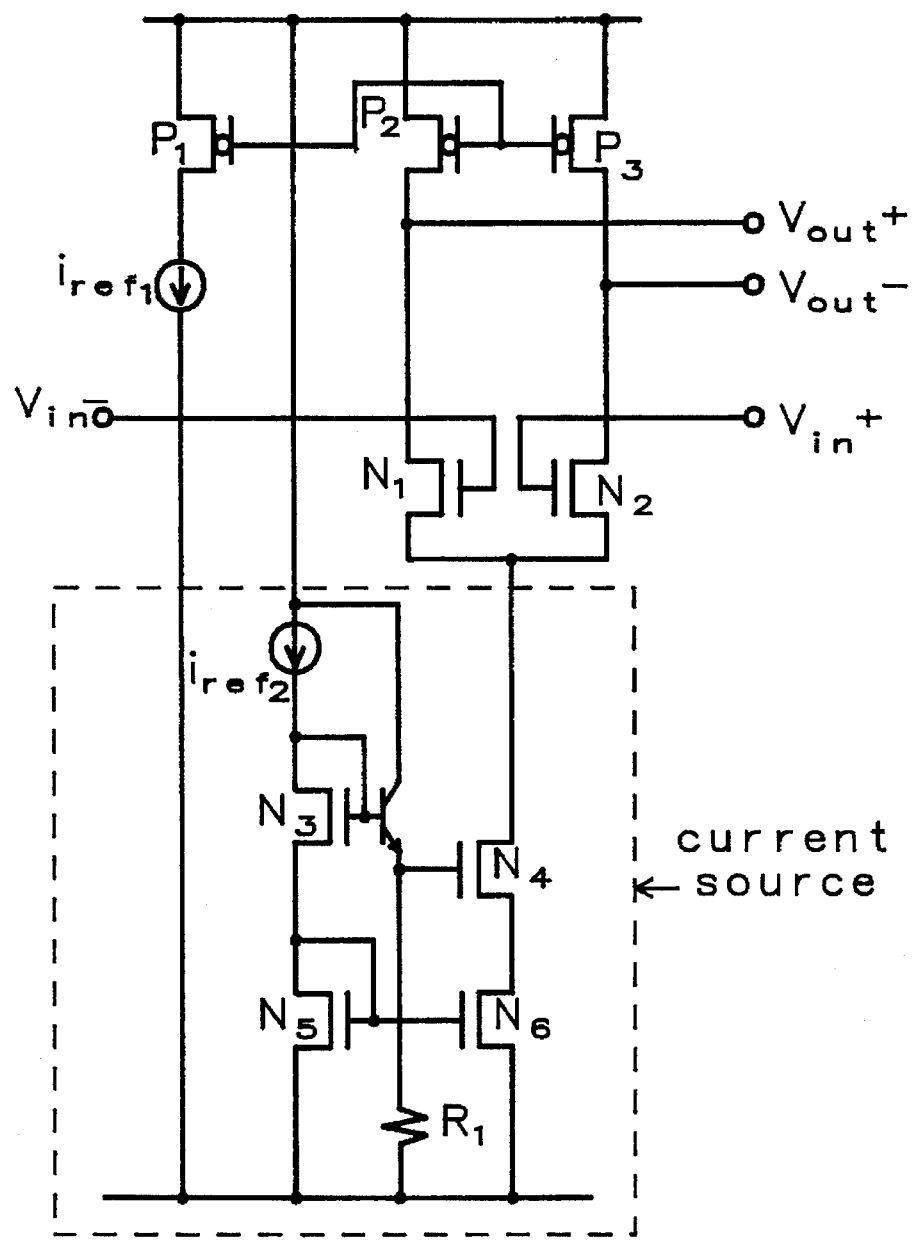
FIG. 7 is a schematic diagram of an application of this invention as a current source.

Another application of the cascode current mirror is shown in FIG. 7. In this design, the current mirror is implemented as a constant current source. The output voltages $V_{out+}$ and $V_{out-}$ will be able to approach a magnitude that is the value of the drain to source saturation voltage of n-MOST $N_1$ and $N_2$ plus approximately the voltage $\Delta v_t$ with $$\Delta v_t = \sqrt{\frac{2 i_{ref}}{\beta}}.$$

The n-MOST $N_1$ and $N_2$; the active loads formed by p-MOST's $P_1$, $P_2$, and $P_3$; and the current source form an Op Amp. The difference in the magnitude of the voltages $V_{in+}$ and $V_{in-}$ cause the output voltages $V_{out+}$ and $V_{out-}$ to be of an magnitude that is proportional to this difference. The magnitude of the current through the current source is twice the magnitude of the current through the active loads formed by the p-MOST's MOST's $P_1$, $P_2$, and $P_3$.

The magnitude of the current n-MOST $N_6$ is proportional to the current source $i_{ref2}$. The proportion is determined by the ratio of the gate width to gate length ratios of the n-MOST's $N_5$ and $N_6$.

While the invention has been particularly shown and described with reference to the preferred embodiments thereof, it will be understood by those skilled in the art that various changes in form and details may be made without departing from the spirit and scope of the invention.

What is claimed is:

1. A cascode MOS transistor current mirror circuit connected between a first power supply line and a second power supply line to supply a constant current of a first magnitude to external circuitry, comprising:

a) a controlling current source having a first terminal connected to the first power supply line and a second terminal;

b) a first MOS transistor comprising a drain, gate, and a source, wherein said drain and gate are connected to the second terminal of the controlling current source;

c) a second MOS transistor comprising a drain, a gate, and a source, wherein said drain and gate are connected to the source of the first MOS transistor and said source is connected to said second power supply line;

d) a bipolar junction transistor comprising a base connected to the gate of the first MOS transistor, a collector connected to the first power supply line, and an emitter;

e) a resistor connected between the second power supply line and the emitter of the bipolar junction transistor; and f) a plurality of cascode current sources operably coupled to said external circuitry.

2. The cascode MOS transistor current mirror of claim 1 wherein each cascode current source of the plurality of cascode current sources, comprises:
   a) a third MOS transistor comprising a drain connect to the external circuitry, a gate connected to the emitter of the bipolar junction transistor, a source and has a property of voltage threshold that is the minimum voltage present from the gate to the source at which said third MOS transistor can conduct a current; and
   b) a fourth MOS transistor comprising a drain connected to the source of the third MOS transistor, a gate connected to the gate of the second MOS transistor, and a source connected to the second power supply line.

3. The cascode MOS transistor current mirror of claim 2 wherein a voltage developed at the drains of the fourth MOS transistors of the plurality of the current sources is of a magnitude that is approximately two time the change in threshold voltage, wherein the change in threshold voltage is determined as two times the square root of two times the first magnitude divided by a transconductance parameter of the third MOS transistor.

4. The cascode MOS transistor current mirror of claim 1 wherein the control current source provides a current of a second magnitude to the drain of the first MOS transistor such that the first magnitude is proportional to the second magnitude.

5. A cascode active load circuit connected between a first power supply line and a second power supply line to supply a current of a first magnitude to an external amplifier and to an external loading circuit, comprising:
   a) a controlling current source having a first terminal connected to the first power supply line and a second terminal;
   b) a first MOS transistor comprising a drain, gate, and a source, wherein said drain and gate are connected to the second terminal of the controlling current source;
   c) a second MOS transistor comprising a drain, a gate, and a source, wherein said drain and gate are connected to the source of the first MOS transistor and said source is connected to said second power supply line;
   d) a bipolar junction transistor comprising a base connected to the gate of the first MOS transistor, a collector connected to the first power supply line, and an emitter;
   e) a resistor connected between the second power supply line and the emitter of the bipolar junction transistor; and
   f) a cascode current source operably coupled to said external amplifier and said external loading circuit.

6. The cascode active load circuit of claim 5 wherein the cascode current source, comprises:
   a) a third MOS transistor comprising a drain connect to the external amplifier and the external load to source the current to said external amplifier and said external load, a gate connected to the emitter of the bipolar junction transistor, a source and has a property of voltage threshold that is the minimum voltage present from the gate to the source at which said third MOS transistor can conduct a current; and
   b) a fourth MOS transistor comprising a drain connected to the source of the third MOS transistor, a gate connected to the gate of the second MOS transistor, and a source connected to the second power supply line.

7. The cascode active load circuit of claim 6 wherein the external amplifier comprises an input terminal and an output terminal, wherein an input signal developed at the input terminal controls an output conductivity at the output terminal.

8. The cascode active load circuit of claim 7 wherein the output terminal is connected to the external loading circuit and to the drain of one of the fourth transistors of the cascode current source.

9. The cascode active load circuit of claim 6 wherein a voltage developed at the drain of the fourth MOS transistor the current source is of a magnitude that is two time the change in threshold voltage, wherein the change in threshold voltage is determined as two times the square root of two times the first magnitude divided by a transconductance parameter of the third MOS transistor.

10. The cascode active load circuit of claim 5 wherein the cascode current source is connected to the external amplifier and the external loading circuit to source the current to said external amplifier and said external loading circuit.

11. The cascode active load circuit of claim 10 wherein the current from the cascode current source is apportioned between the external amplifier and the external loading circuit, wherein the manner in which the constant current is apportioned is dependent on the output conductivity of the amplifier, and a voltage developed across the external loading circuit is dependent upon the amount of the current from the cascode current source that is apportioned to said external loading circuit.

12. The cascode active load circuit of claim 5 wherein the controlling current source provides a current of a second magnitude to the drain of the first MOS transistor, wherein the first magnitude is proportional to the second magnitude.

13. A cascode current source circuit connected between a first power supply and a second power supply to supply a current of a first magnitude to a differential pair of MOS transistors within an operational amplifier, comprising:
   a) a controlling current source having a first terminal connected to the first power supply line and a second terminal;
   b) a first MOS transistor comprising a drain, gate, and a source, wherein said drain and gate are connected to the second terminal of the controlling current source;
   c) a second MOS transistor comprising a drain, a gate, and a source, wherein said drain and gate are connected to the source of the first MOS transistor and said source is connected to said second power supply line;
   d) a bipolar junction transistor comprising a base connected to the gate of the first MOS transistor, a collector connected to the first power supply line, and an emitter;
   e) a resistor connected between the second power supply line and the emitter of the bipolar junction transistor; and
   f) a cascode current source operably coupled to said differential pair of MOS transistors.

14. The cascode current source circuit of claim 13 wherein the cascode current source, comprises:
   a) a third MOS transistor comprising a drain connected to the differential pair of MOS transistors to source the current of the first magnitude to said differential pair of MOS transistors, a gate connected to the emitter of the bipolar junction transistor, a source and has a property of voltage threshold that is the minimum voltage present from the gate to the source at which said third MOS transistor can conduct a current; and
   b) a fourth MOS transistor comprising a drain connected to the source of the third MOS transistor, a gate connected to the gate of the second MOS transistor, and a source connected to the second power supply line.

15. The cascode current source circuit of claim 14 wherein the differential pair of MOS transistors comprises:

a) a fifth MOS transistor comprising a drain, a gate, and a source; and b) a sixth MOS transistor comprising a drain, a gate, and a source.

16. The cascode current source circuit of claim 15 wherein the sources of the fifth and sixth MOS transistors are connected together and to the drain of the third MOS transistor of the cascode current source.

17. The cascode current source circuit of claim 14 wherein a voltage developed at the drain of the fourth MOS transistor of the current source is of a magnitude that is two times the change in threshold voltage, wherein the change in threshold voltage is determined as two times the square root of two times the first magnitude divided by a transconductance parameter of the third MOS transistor.

18. The cascode current source circuit of claim 13 wherein the cascode current source is connected to the differential pair to source the current of the first magnitude to said differential pair.

19. The cascode current source circuit of claim 13 wherein the control current source provides a current of a second magnitude to the drain of the first MOS transistor such that the first magnitude is proportional to the second magnitude.

* * * * *